(12) United States Patent
Yamatoya et al.

(10) Patent No.: US 7,733,934 B2
(45) Date of Patent: Jun. 8, 2010

(54) OPTICAL WAVEGUIDE AND SEMICONDUCTOR OPTICAL ELEMENT

(75) Inventors: Takeshi Yamatoya, Tokyo (JP); Yasunori Miyazaki, Tokyo (JP); Toshitaka Aoyagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 244 days.

(21) Appl. No.: 11/775,928

(22) Filed: Jul. 11, 2007

(65) Prior Publication Data

US 2008/0037605 A1 Feb. 14, 2008

Related U.S. Application Data

(63) Continuation-in-part of application No. 11/613,296, filed on Dec. 20, 2006, now abandoned.

(51) Int. Cl.
*H01S 5/00* (2006.01)
(52) U.S. Cl. .................................. 372/45.01
(58) Field of Classification Search ............... 372/45.01
See application file for complete search history.

(56) References Cited

U.S. PATENT DOCUMENTS 5,604,762 A * 2/1997 Morinaga et al. ........ 372/43.01

5,987,046 A * 11/1999 Kobayashi et al. ....... 372/45.01

FOREIGN PATENT DOCUMENTS

| JP | 8-078792 | 3/1996 |
|---|---|---|
| JP | 9-061652 | 3/1997 |
| JP | 2000-228558 | 8/2000 |
| JP | 2002-374035 | 12/2002 |
| JP | 2005-020037 | 1/2005 |

* cited by examiner

*Primary Examiner*—Minsun Harvey
*Assistant Examiner*—Patrick Stafford
(74) *Attorney, Agent, or Firm*—Leydig, Voit & Mayer, Ltd.

(57) ABSTRACT

An optical waveguide has a semiconductor laser section, an intermediate section, and an optical modulator section on a surface of a substrate. The distance of a surface extending outwardly from and transverse to both sides of a mesa stripe in the semiconductor laser section from the surface of the substrate is larger than the distance of a surface extending outwardly from and transverse to both sides of the mesa stripe in the optical modulator section from the surface of the substrate. The distance of a surface extending outwardly from and transverse to both sides of the mesa stripe in the intermediate section from the surface of the substrate decreases from the semiconductor laser section toward the optical modulator section.

13 Claims, 13 Drawing Sheets

A

B

C

D

E

OPTICAL WAVEGUIDE AND SEMICONDUCTOR OPTICAL ELEMENT

BACKGROUND OF THE INVENTION

1. Field of the Invention

The present invention relates to an optical waveguide, a semiconductor optical integrated element, and methods for manufacturing the same, more specifically to an optical waveguide and a semiconductor optical integrated element, wherein the reflection of laser beams is reduced at the boundary portion of the optical waveguide, and methods for manufacturing the same.

2. Background Art

As an optical waveguide for a semiconductor laser, there are a ridge-type waveguide wherein an upper clad layer is etched to mesa stripes to confine light in the horizontal direction, and a high-mesa-type waveguide wherein not only an upper clad layer but also a core layer and a lower clad layer are etched to mesa stripes.

Since the ridge-type waveguide has a structure not etching the core layer, the defect level of the side of the semiconductor optical element can be reduced. On the other hand, the high-mesa-type waveguide has features of larger light confinement in the horizontal direction and the reduction of electrical capacitance (for example, refer to Japanese Patent Application Laid-Open No. 2000-228558).

Since the characteristics of the ridge-type waveguide differ from the characteristics of the high-mesa-type waveguide, these waveguides can be combined in a semiconductor optical integrated element to improve overall characteristics. For example, in a semiconductor laser formed by integrating electric field absorbing optical modulators, the semiconductor laser section is formed of a ridge-type waveguide structure, and the optical modulator section is formed of a high-mesa-type waveguide structure. Since the defect level can be reduced by such a structure, laser characteristics can be improved in the laser section, the electric capacitance can be reduced in the optical modulator section, and high-speed modulation becomes possible.

In the above-described semiconductor optical integrated element, the optical mode distribution of a ridge-type waveguide differs from that of a high-mesa-type waveguide. Therefore, light is reflected at the boundary portion between the waveguides, and the characteristics of the semiconductor optical integrated element is deteriorated. For example, a semiconductor laser formed by integrating electric field absorbing optical modulators had a problem wherein the single-wavelength properties of the laser was deteriorated by the reflection of light at the boundary between the laser section and the optical modulator section.

SUMMARY OF THE INVENTION

To solve the above-described problem, it is an object of the present invention is to provide an optical waveguide having a ridge-type waveguide and a high-mesa-type waveguide on the same substrate, a semiconductor optical integrated element having a structure to reduce the reflection of light at the boundary between the ridge-type waveguide and the high-mesa-type waveguide, and methods for manufacturing the same.

According to one aspect of the present invention, an optical waveguide has a semiconductor laser section, an intermediate section, and an optical modulator section. The semiconductor laser section has a lower clad layer, a first core layer, and an upper clad layer sequentially laminated on a substrate; wherein mesa stripes wherein the upper clad layer is extended to both outsides are formed; and laser beams are generated in the first core layer. The intermediate section is provided adjacent to the semiconductor laser section on the substrate, and having the lower clad layer, a second core layer, and the upper clad layer sequentially laminated on the substrate, wherein the second core layer is connected to the first core layer, and mesa stripes wherein the lower clad layer, the second core layer, and the upper clad layer are extended to both outsides are formed. The optical modulator section is provided adjacent to the intermediate section on the substrate, and having the lower clad layer, a second core layer, and the upper clad layer sequentially laminated on the substrate; wherein the second core layer absorbs the laser beams generated in the first core layer, and mesa stripes wherein the lower clad layer is extended to both outsides are formed. The height of the surface extending to both outsides of the mesa stripes of the semiconductor laser section from the upper surface of the substrate is higher than the height of the surface extending to both outsides of the mesa stripes of the optical modulator section from the upper surface of the substrate. The height of the surface extending to both outsides of the mesa stripes of the intermediate section from the upper surface of the substrate descends from the semiconductor laser section side toward the optical modulator section side.

According to the present invention, there are provided an optical waveguide having a ridge-type waveguide and a high-mesa-type waveguide on the same substrate, a semiconductor optical integrated element having a structure to reduce the reflection of light at the boundary between the ridge-type waveguide and the high-mesa-type waveguide, and methods for manufacturing the same.

According to the present invention, there are provided a semiconductor optical integrated element having a light-generating first core layer formed on the upper layer of a part of the lower clad layer, a light-absorbing second core layer formed on the upper layer of the lower clad layer in the region where the first core layer is not formed, and an upper clad layer formed so as to overlap the upper layers of the first core layer and the second core layer, wherein the second core layer has a decrescent section having a surface that contacts the first core layer, wherein the width of the second core layer in the direction parallel to the contacting surface is gradually reduced to a predetermined width in the direction parting from the contacting surface, and a stripe section contacting the portion of the decrescent section having the predetermined width and linearly formed to have the predetermined width.

Other and further objects, features and advantages of the invention will appear more fully from the following description.

DETAILED DESCRIPTION OF THE PREFERRED EMBODIMENTS

Figure 1:
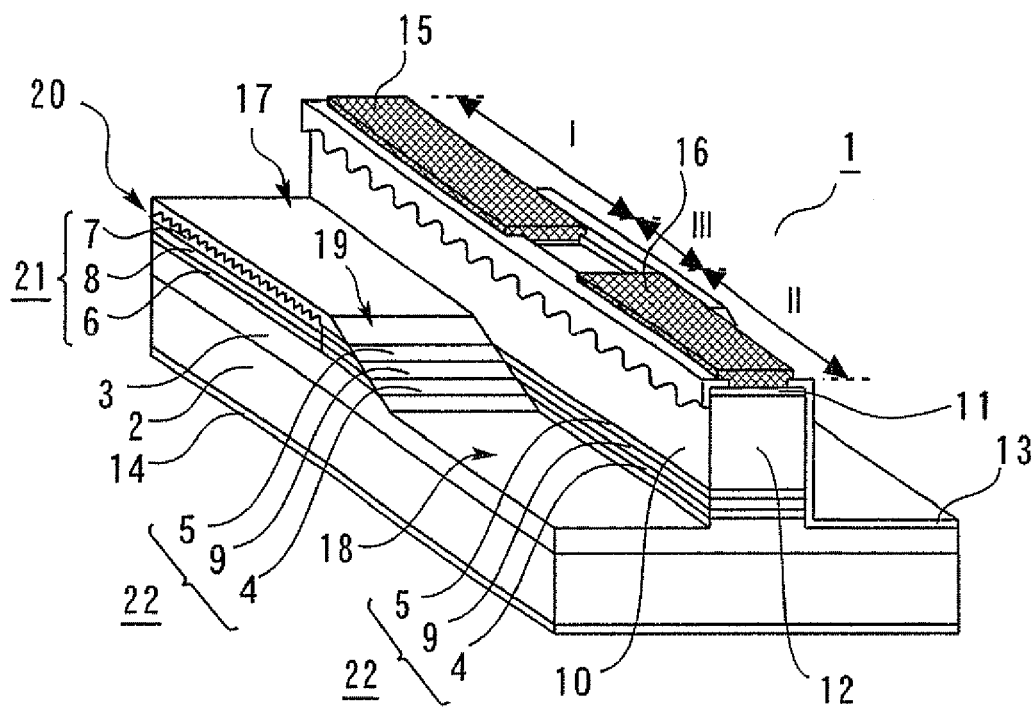
FIG. 1 is a perspective view of an optical waveguide and a semiconductor optical integrated element according to the first embodiment of the present invention.

The embodiments of the present invention will be described below referring to the drawings. In the drawings, the same or corresponding parts will be denoted by the same reference numerals or characters, and the description thereof will be simplified or omitted.

First Embodiment

An optical waveguide and a semiconductor optical integrated element according to the first embodiment will be described referring to FIG. 1. FIG. 1 is a perspective view of an optical modulator integrated laser where in an electric field absorption optical modulator (EA modulator) and a distributed feedback semiconductor laser (DFB-LD) are monolithically integrated.

The above-described optical modulator and semiconductor laser are formed on the same p-type InP substrate (hereafter, simply referred to as "substrate"). An optical waveguide that generates and emits laser beams is composed of the above-described optical modulator and semiconductor laser. The optical waveguide is composed of a distributed feedback semiconductor laser section (hereafter, simply referred to as "semiconductor laser section") I, an electric field absorbing optical modulator section (hereafter, simply referred to as "optical modulator section") II, and an isolation section III as an intermediate section to electrically isolate the semiconductor laser section from the optical modulator section. The entire system including the substrate, the optical waveguide, the semiconductor laser, and the optical modulator will be hereafter referred to as an "optical modulator semiconductor laser".

As FIG. 1 shows, mesa stripes 12 are provided along the lengthwise direction of the optical modulator integrated semiconductor laser 1 so as to intersect the central portions of the semiconductor laser section I, the isolation section III, and the optical modulator section II. A plane 17 is extended to both outsides of the mesa stripes 12 of the semiconductor laser section I, and the height of the plane 17 from the upper surface of the substrate 2 is greater than the height of a plane 18 extending to both outsides of the mesa stripes 12 of the optical modulator section II.

A plane 19 is extended to both outsides of the mesa stripes 12 of the isolation section III, and the height of the plane 19 from the upper surface of the substrate 2 descends stepwise from the semiconductor laser section I toward the optical modulator section II.

Next, the structure of the semiconductor laser section I will be described. In this section, a p-type InP clad layer (hereafter referred to as "lower clad layer") 3 is provided on the substrate 2; and an InGaAsP separation and confining hetero layer (hereafter referred to as "SCH layer") 6, an active layer of the semiconductor laser composed of an InGaAsP/InGaAsP strained MQW (multiple quantum well) (hereafter simply referred to as "active layer") 8, and an SCH layer 7 are sequentially laminated on the lower clad layer 3. A first core layer 21 is composed of the SCH layer 6, the active layer 8, and the SCH layer 7.

On the upper portion of the SCH layer 7 is provided a diffraction lattice 20 formed by periodical etching. Further thereon is provided an n-type InP clad layer (hereafter referred to as "upper clad layer") 10, in which both outsides of the mesa stripes 12 are etched. On the upper portion of the mesa stripes 12 is provided an n-type InGaAs contact layer (hereafter simply referred to as "contact layer") 11 and thereon is provided an n-type electrode 15. On the back surface side of the substrate 2 is provided a p-type electrode 14.

Thus in the semiconductor laser section I, the lower clad layer 3, the first core layer 21, and the upper clad layer 10 are laminated on the substrate 2; and the upper clad layer 10 is extended to both outside of the mesa stripes 12. By applying a voltage between the p-type electrode 14 and the n-type electrode 15, laser beams are generated from the first core layer 21.

In the semiconductor laser section I, the refractive indices of the active layer 8, and SCH layers 6 and 7 are higher than the refractive indices of the lower clad layer 3 and the upper clad layer 10. Therefore, the first core layer 21 can confine the light in the direction vertical to the substrate 2. The plane 17 on both outsides of the mesa stripes 12 is on the location higher than the upper surface of the first core layer 21, specifically the upper surface of the SCH layer 7 to form a ridge-type optical waveguide structure.

Next, the isolation section III will be described. The isolation section III is adjacently provided between the semiconductor laser section I and the optical modulator section II on the substrate 2. On the substrate 2 is provided a lower clad layer 3, and an SCH layer 4, an optical modulator absorption layer having a high refractive index (InGaAsP/InGaAsP strained MQW, hereafter simply referred to as "absorption layer") 9, and an SCH layer 5 are sequentially laminated thereon. A second core layer 22 is composed of the SCH layer 4, the absorption layer 9, and the SCH layer 5. Further thereon is provided an upper clad layer 10. The second core layer 22 is connected to the first core layer 21 at the boundary between the semiconductor laser section I and the isolation section III. On both outsides of the mesa stripes 12, the lower clad layer 3, the second core layer 22 and the upper clad layer 10 are extended on the slanted plane 19.

Thus, in the isolation section III, the height of the plane 19 of both outsides of the mesa stripes 12 gradually descends toward the direction of the mesa stripes 12. The plane 19 has the structure to connect the planes 17 and 18 of both outsides of the mesa stripes 12 of the semiconductor section I and the optical modulator section II.

Next, the optical modulator section II will be described. The optical modulator section II is provided adjacent to the isolation section III on the substrate 2. In the same way as the isolation section III, a lower clad layer 3 is provided on the substrate 2, and a second core layer 22 and an upper clad layer 10 are provided thereon. Since the second core layer 22 has an absorption layer 9 having a high refraction index, the second core layer 22 can absorb laser beams generated in the first core layer 21. On the sides of mesa stripes 12, the upper clad layer 10 and the second core layer 22 are exposed; and on both outsides of mesa stripes 12, the lower clad layer 3 is extended. A contact layer 11 is provided on the upper surface of the mesa stripes 12, and an n-type electrode 16 is provided thereon. On the back surface of the substrate 2, a p-type electrode 14 is provided.

Thus, the optical modulator section II has a high-mesa-type optical waveguide structure wherein the second core layer 22 is composed of the absorption layer 9 having a high refraction index and SCH layers 4 and 5, and the plane 18 of both outsides of the mesa stripes 12 is lower than the lower surface of the second core layer 22, that is, the lower surface of the SCH layer 4.

Specifically, by the structure shown in FIG. 1, the optical mode distribution shape of laser beams can be gradually varied from the semiconductor laser section I toward the optical modulator section II of the isolation section III. Thereby, the reflection of light at the boundary between the semiconductor laser section I of the ridge-type waveguide and the optical modulator section II of the high-mesa-type waveguide can be effectively reduced. As a result, the deterioration of laser single wavelength properties caused by reflection of light at the boundary between the semiconductor laser section I and the optical modulator section II can be suppressed.

Figure 2:
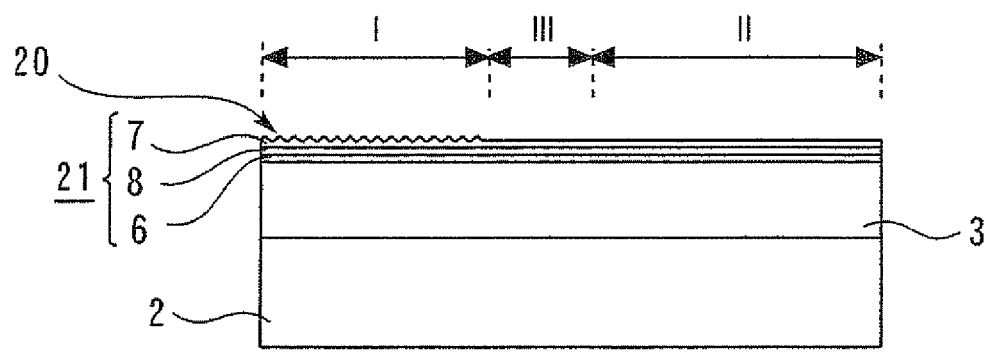
FIGS. 2-7 are sectional views for explaining a method of manufacturing an optical waveguide and a semiconductor optical integrated element according to the first embodiment of the present invention.

Next, the method for manufacturing the optical waveguide and the semiconductor optical integrated element shown in FIG. 1 will be described referring to FIGS. 2 to 7. First, as FIG. 2 shows, a lower clad layer 3 composed of p-type InP, an SCH layer 6, an active layer 8, and an SCH layer 7 are sequentially laminated on a substrate 2 by an MOCVD (metal organic vapor phase growth) method. Furthermore, a diffraction lattice 20 is formed on the SCH layer 7 by periodical etching.

Figure 3:
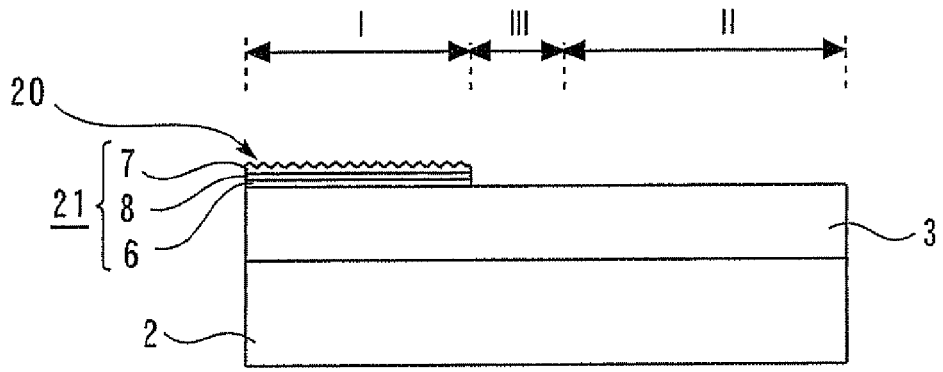

Next, the active layer 8 and SCH layers 6 and 7 in the regions where the isolation section and the optical modulator section are finally formed (hereafter referred to as "region III" and "region II", respectively) are selectively etched off. As a result, as FIG. 3 shows, the first core layer 21 that generates laser beams is formed on the lower clad layer 3 of the region where the semiconductor laser section is finally formed (hereafter referred to as "region I") on the substrate 2, among the region I, the region II and the region III.

Figure 4:
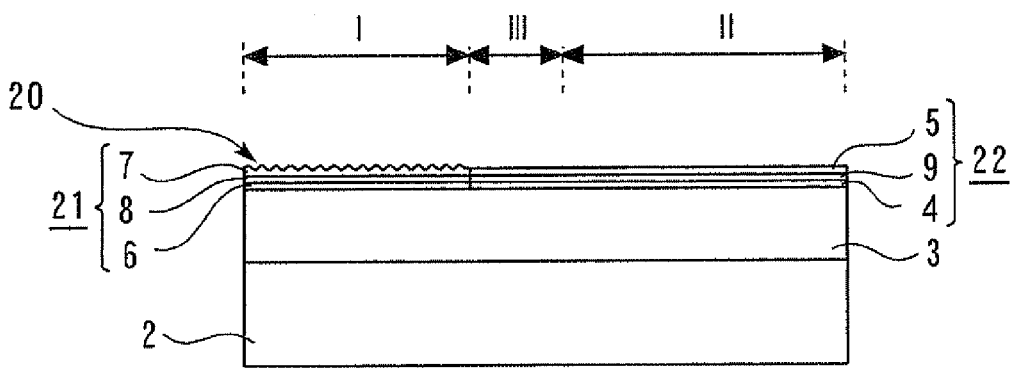

Next, as FIG. 4 shows, the SCH layer 4, the absorption layer 9 and the SCH layer 5 are sequentially formed in regions III and II by the MOCVD method. At this time, the active layer 8 of the region I is joined to the absorption layer 9 of the regions II and III by a butt joint. As a result, a second core layer 22 for absorbing laser beams generated from the finally formed semiconductor laser section connected to the first core layer 21 is formed on the lower clad layer 3 of the regions II and III.

Figure 5:
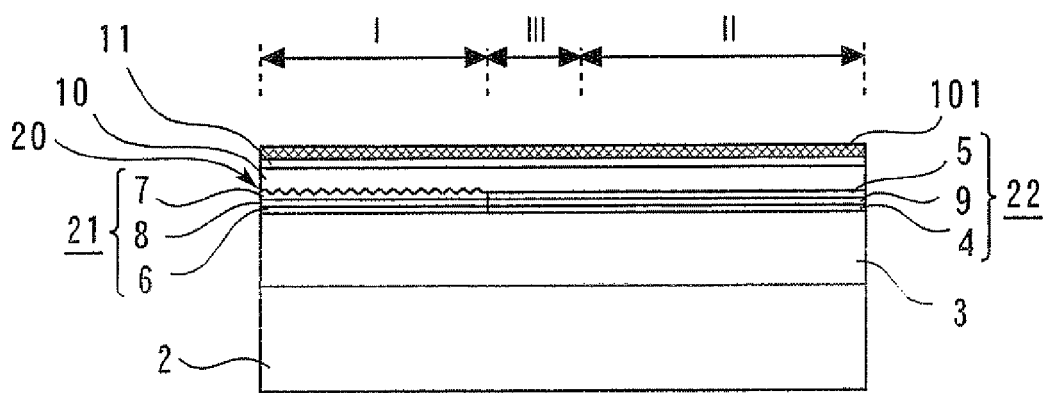

Next, an upper clad layer and the contact layer are sequentially formed by the MOCVD method on the entire surface of the substrate 2. As a result, as FIG. 5 shows, an upper clad layer 10 and a contact layer 11 are formed on the first core layer 21 and the second core layer 22. Furthermore, a mask pattern 101 composed of a silicon oxide film, a silicon nitride film, a photo resist or the like is formed on the contact layer 11.

Figure 6:
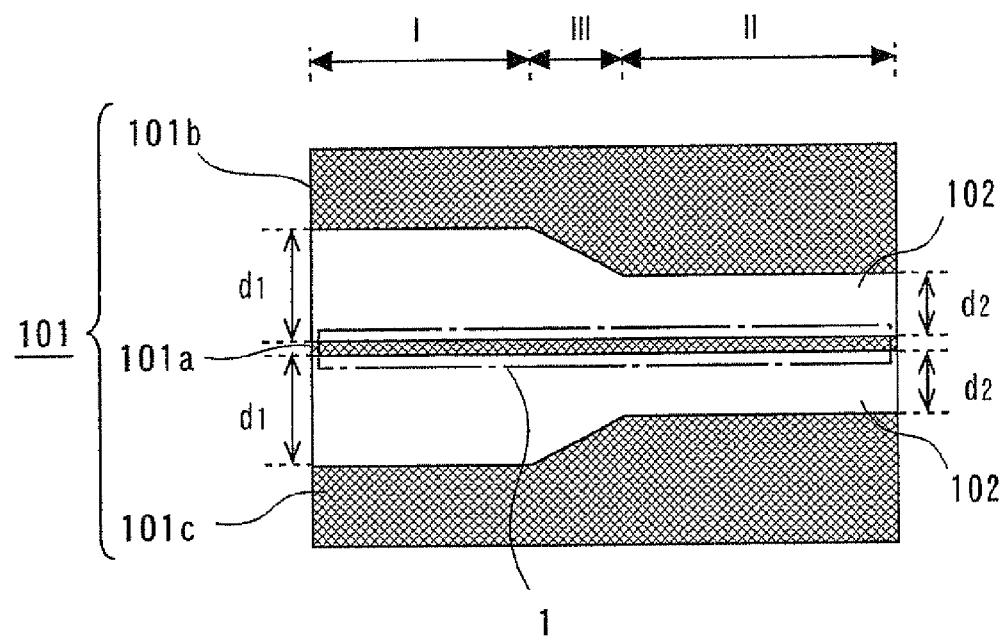

FIG. 6 is a plan view of the above-described mask pattern 101 viewed from the upper surface side of the substrate 2. The mask pattern 101 is composed of a stripe-shaped first pattern 101a intersecting the region I, the region III, and the region II in a predetermined width; and a pair of the second patterns 101b and 101c disposed facing the first pattern 101a. (The location of the finally formed optical modulator integrated semiconductor laser 1 on the wafer is shown in FIG. 6.)

In the region I, the first and second patterns are disposed so that the distance between the first pattern 101a and the second pattern 101b, and the distance between the first pattern 101a and the second pattern 101c are $d_1$. In the region II, the first and second patterns are disposed so that the distance between the first pattern 101a and the second pattern 101b, and the distance between the first pattern 101a and the second pattern 101c are $d_2$ smaller than $d_1$. In the region III, the first and second patterns are disposed so that the distance between the first pattern 101a and the second pattern 101b, and the distance between the first pattern 110a and the second pattern 101c gradually descend from $d_1$ to $d_2$. Thus an opening 102 is provided between the first pattern 101a and the second pattern 101b of the mask pattern 101, and between the first pattern 101a and the second pattern 101c of the mask pattern 101, respectively.

Specifically, a stripe-shaped first pattern 101a extends to the central portion of the mask pattern 101 so as to intersect the region I, the region III and the region II; and an opening 102 is provided in each side thereof. The width of the opening 102 in the region I is larger than the width of the opening 102 in the region II. In the region III, the width of the opening 102 gradually varies so as to connect the opening 102 in the region I to the opening 102 in the region II.

Next, the upper surface of the substrate 2 is selectively etched using the mask pattern 101 as the mask. For example, dry etching, such as RIE (reactive ion etching) and ICP (inductively coupled plasma) is performed. As a result, the structure as shown in FIG. 7 perspective view) can be obtained.

In the above-described etching, the etching rate is varied depending on the width of the opening 102 of the mask pattern 101 shown in FIG. 6. In the region I, since the width of the opening 102 is large, the etching rate in this region is small, and in the region II, since the width of the opening 102 is smaller compared with the width of the opening 102 in the region I, the etching rate is relatively larger than the etching rate in the region I. In the region III, since the width of the opening 102 gradually descends from the region I toward the region II, the etching rate gradually ascends from the region I side toward the region II side.

Figure 7:
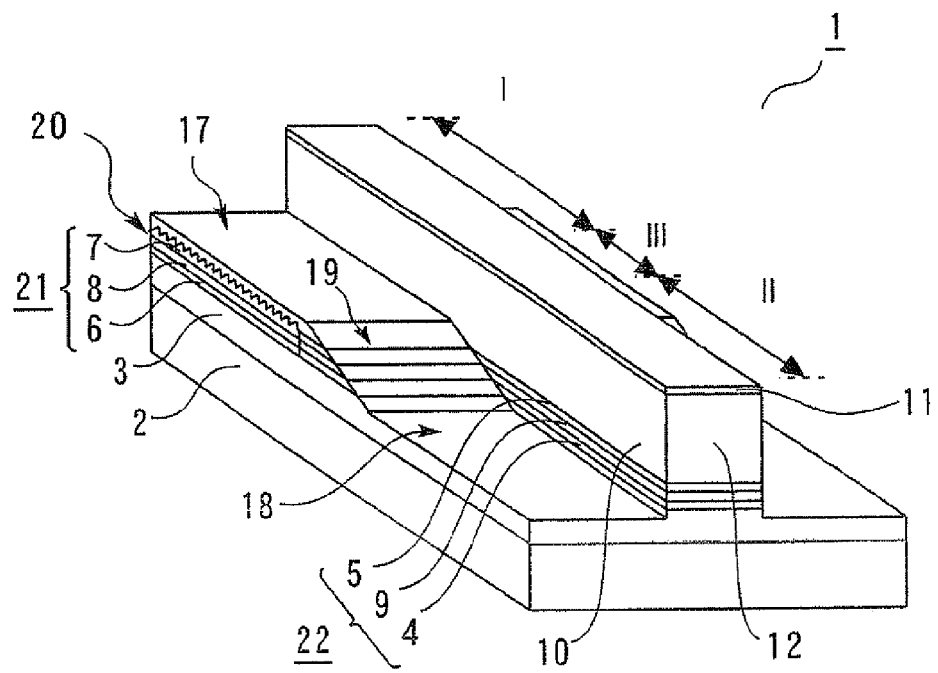

Therefore, as FIG. 7 shows, in the region I, the plane 17 on both sides of the mesa stripes 12 is higher than the upper surface of the first core layer 21, specifically, the upper surface of the SCH layer 7. In addition, in the optical modulator section II, the plane 18 on both sides of the mesa stripes 12 is lower than the bottom surface of the second core layer 22, specifically, the bottom surface of the SCH layer 4. Further in the region III, the height of the plane 19 on both sides of the mesa stripes 12 gradually ascends from the region I side toward the region II in the stripe direction to connect the plane 17 to the plane 18 at a slant.

Next, the mask pattern 101 used in the above-described etching is removed, and the contact layer 11 in the isolation section III is removed. Furthermore, a silicon oxide film is formed on the surface other than immediately above the mesa stripes 12. Finally, an n-type electrode and a p-type electrode are formed. As a result, the structure as shown in FIG. 1 is obtained.

By the above-described manufacturing method, the structure as shown in FIG. 1, specifically, the structure having the semiconductor laser section I of a ridge-type waveguide, the optical modulator section II of a high-mesa-type waveguide, and an isolation section III that connects the semiconductor laser section I to the optical modulator section II is obtained. Thus, an optical waveguide to connect the semiconductor laser section I to the optical modulator section, wherein the height of the plane on both sides of mesa stripes is gradually varied in the isolation section III; and an optical modulator integrated semiconductor laser having the optical waveguide can be obtained.

Second Embodiment

An optical waveguide and a semiconductor optical integrated element according to the second embodiment will be described referring to FIG. 8. Here, the description will be focused around aspects different from the first embodiment.

Figure 8:
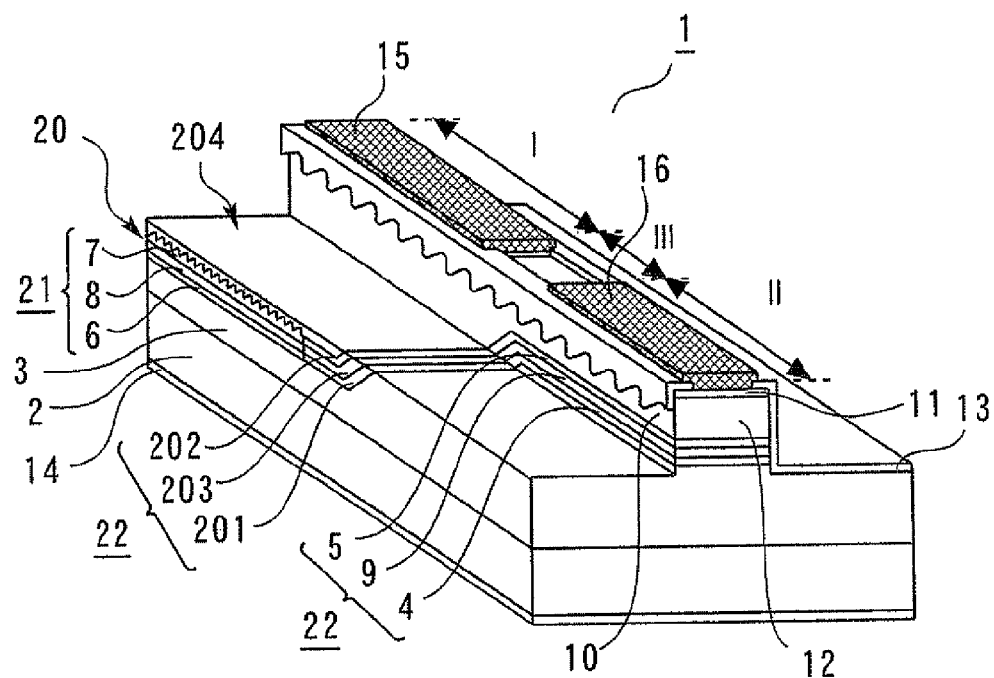
FIG. 8 is a perspective view of an optical waveguide and a semiconductor optical integrated element according to the second embodiment of the present invention.

As FIG. 8 shows, mesa stripes 12 are provided so as to intersect the central portions of a semiconductor laser section I, an isolation section III, and an optical modulator section II; and the height of the plane 204 extending to both outsides the mesa stripes 12 from the upper surface of the substrate 2 is constant. In the isolation section III, the height of the second core layer 22 from the upper surface of the substrate 2 ascends from the semiconductor laser section I side toward the optical modulator section II side.

In the semiconductor laser section I, the refractive indices of the active layer 8, and SCH layers 6 and 7 are higher than the refractive indices of the lower clad layer 3 and the upper clad layer 10. Therefore, the first core layer 21 can confine the light in the direction vertical to the substrate 2. The upper surface of the first core layer 21, specifically the upper surface of the SCH layer 7 is on the location lower than the planes 204 of both outsides of the mesa stripes 12 to form a ridge-type optical waveguide structure.

On the other hand, the optical modulator section II has a structure wherein the height from the upper surface of the substrate 2 to the lower end of the second core layer 22 is greater than the height from the upper surface of the substrate 2 to the upper end of the first core layer 21 in the semiconductor laser section I. Specifically, the optical modulator section II has a high-mesa-type optical waveguide structure wherein the second core layer 22 is composed of the absorption layer 9 having a high refraction index and SCH layers 4 and 5, and the lower surface of the second core layer 22, that is, the lower surface of the SCH layer 4 is higher than the plane 204 of both outsides of the mesa stripes 12.

In the isolation section III present between the semiconductor laser section I and the optical modulator section II, the heights of the absorption layer 203 and SCH layers 201 and 202 composing the second core layer 22 from the upper surface of the substrate 2 are gradually varied. At the boundary between the semiconductor laser section I and the isolation section III, the active layer 8 and SCH layers 6 and 7 of the semiconductor laser section I are connected to the absorption layer 203 and SCH layers 201 and 202 of the isolation section III, respectively.

In the structure shown in FIG. 8, the height of the first core layer 21 from the upper surface of the substrate 2 in the semiconductor laser section I is different from the height of the second core layer 22 in the optical modulator section II. In the isolation section III, the height of the second core layer 22 from the upper surface of the substrate 2 is gradually varied to connect the first core layer 21 in the semiconductor laser section I to the second core layer 22 in the optical modulator section II. Thereby, the reflection of light at the boundary between the ridge-type waveguide and the high-mesa-type waveguide can be reduced. As a result, the deterioration of laser single wavelength properties caused by reflection of light at the boundary between the semiconductor laser section I and the optical modulator section II can be suppressed.

Figure 9:
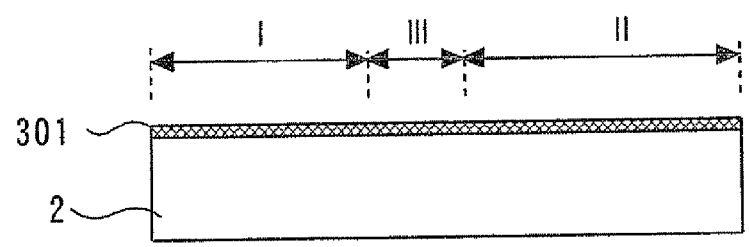
FIGS. 9-17 are sectional views for explaining a method of manufacturing an optical waveguide and a semiconductor optical integrated element according to the second embodiment of the present invention.

Next, the method for manufacturing the optical waveguide and the semiconductor optical integrated element shown in FIG. 8 will be described referring to FIGS. 9 to 17. First, as FIG. 9 shows, a first mask pattern 301 composed of a silicon oxide film or the like is formed in the region I, the region II, and the region III on the substrate 2. The region I, the region II, and the region III on the substrate 2 are regions where the semiconductor laser section I, the optical modulator section II, and the isolation section III are finally formed, respectively.

Figure 10:
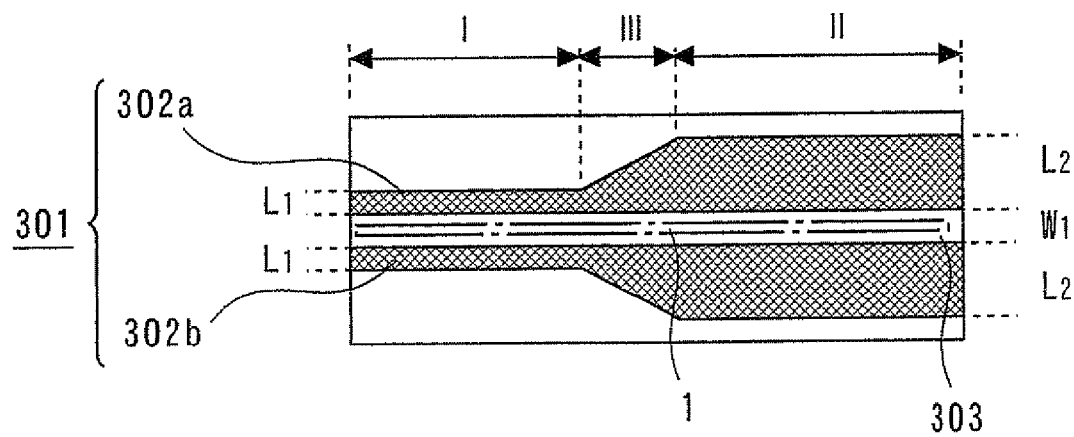

FIG. 10 shows a plan view of the first mask pattern 301 viewed from the upper surface side of the substrate 2. The first mask pattern 301 is composed of two stripe-shaped mask patterns 302a and 302b intersecting the above-described region I, region II, and region III at predetermined distance $W_1$. These mask patterns have a first width $L_1$ in the region I, and a second width $L_2$ larger than the first width $L_1$ in the region II. In the region III, the width gradually ascends from $L_1$ to $L_2$ from the region I side toward the region II side. (The location of the finally formed optical modulator integrated semiconductor laser 1 on the wafer is shown in FIG. 10.)

Between the mask pattern 302a and the mask pattern 302b, a stripe-shaped opening 303 is formed. The widths of the mask patterns 302a and 302b are larger in the region II than in the region I. In the region III, the width is varied so as to connect the mask patterns 302a and 302b in the region I and the region II.

Figure 11:
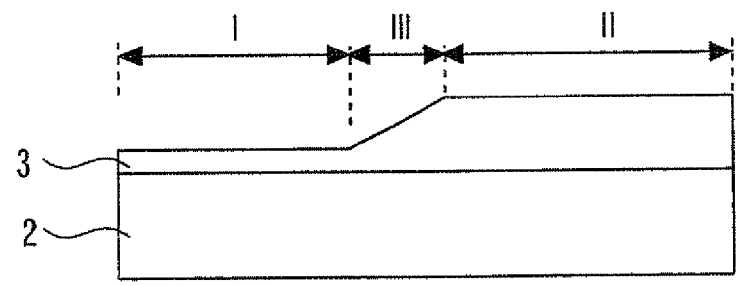

Next, a lower clad layer 3 is formed by metal organic vapor phase epitaxial growth using the above-described first mask pattern 301 as a mask. At this time, the selective crystal growth of the lower clad layer is performed in the location of the opening 303 provided between the two stripes of the first mask pattern 301 in the region I, the region II, and the region III on the substrate 2. As a result, the cross-section of the portion along the lengthwise direction of the opening 303 shown in FIG. 10 becomes as shown in FIG. 11. Specifically, in the semiconductor laser section I, the isolation section III, and the optical modulator section II, a structure wherein the thickness of the lower clad layer 3 is varied along the opening 303 is obtained.

In the above-described selective growth, the growth rate is varied depending on the widths of the mask patterns 302a and 302b in both sides of the opening 303 of the mask pattern 301 shown in FIG. 10. Specifically, in the region I, since the width of the mask patterns 302a and 302b is small in the region I, the crystal growth rate in this region is low. In the region II, since the width of the mask patterns 302a and 302b is larger than in the region I, the crystal growth rate in this region is relatively larger than in the region I. In the region III, since the width of the mask patterns 302a and 302b gradually ascends from the region I toward the region II, the crystal growth rate gradually ascends from the region I toward the region II.

As a result, as FIG. 11 shows, the thickness of the lower clad layer 3 in the region I is smaller than the thickness of the lower clad layer 3 in the region II, and in the region III, the thickness is gradually varied to connect the lower clad layers 3 in the region I and the region II. Thus, a lower clad layer is selectively formed in the location of the opening 303 provided between the two stripes of the first mask pattern 301 formed on the substrate 2. Thereafter, although not shown in the drawing, the first mask pattern 301 is removed.

Figure 12:
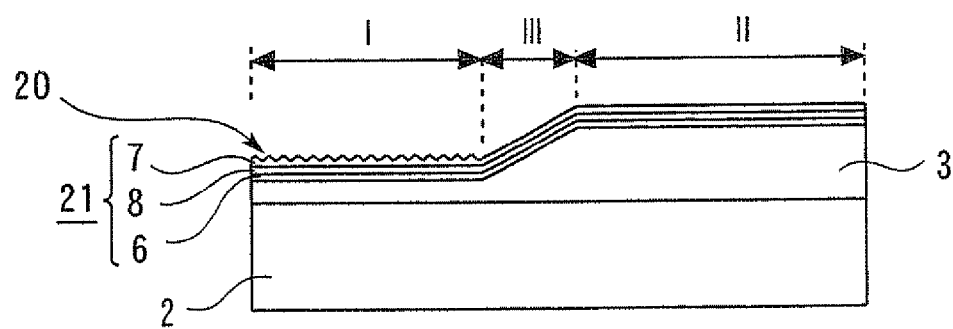

Next, as FIG. 12 shows, an SCH layer 6, an active layer 8, and an SCH layer 7 are sequentially laminated on the substrate 2. Then, by periodical etching, a refraction lattice 20 is formed on the SCH layer 7 of the region I. Next, although not shown in the drawing, the SCH layers 6 and 7, and the active layer 8 in the region II and the region III are etched off. Thus a first core layer 21 that generates laser beams is formed on the lower clad layer 3 in the region I.

Figure 13:
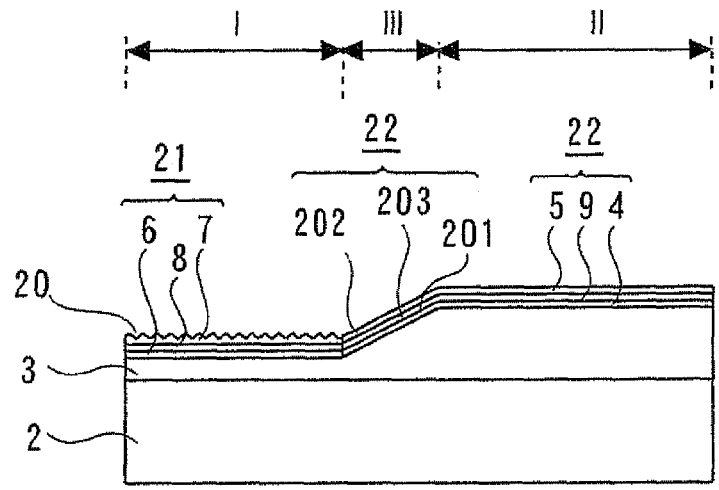

Next, as FIG. 13 shows, an SCH layer 4, an absorption layer 9, and an SCH layer 5 are sequentially laminated in the region II by an MOCVD method to form a second core layer 22. At the same time, an SCH layer 201, an absorption layer 203, and an SCH layer 202 are sequentially laminated in the region III to form a second core layer 22. At this time, the active layer 8 and SCH layers 6 and 7 of the first core layer 21 in the region I are joined to the active layer 203 and SCH layers 201 and 202 of the second core layer 22 in the region III by butt joint, respectively. Thus, the second core layer 22 connected to the first core layer 21 for absorbing laser beams is formed on the lower clad layer 3 in the region III and the region II.

Figure 14:
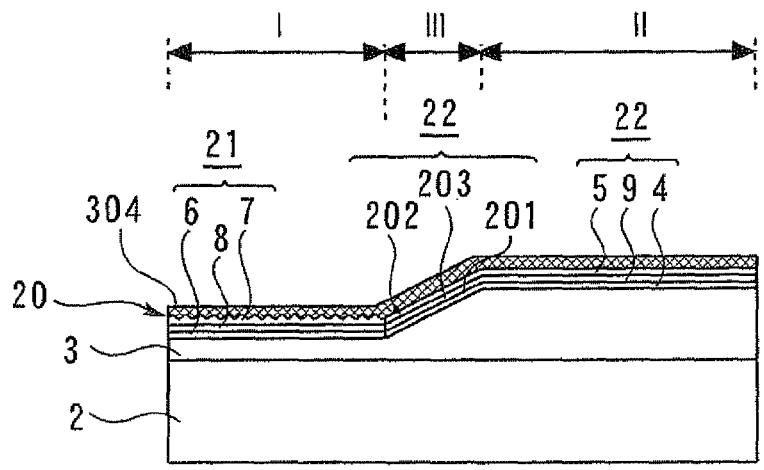
Figure 15:
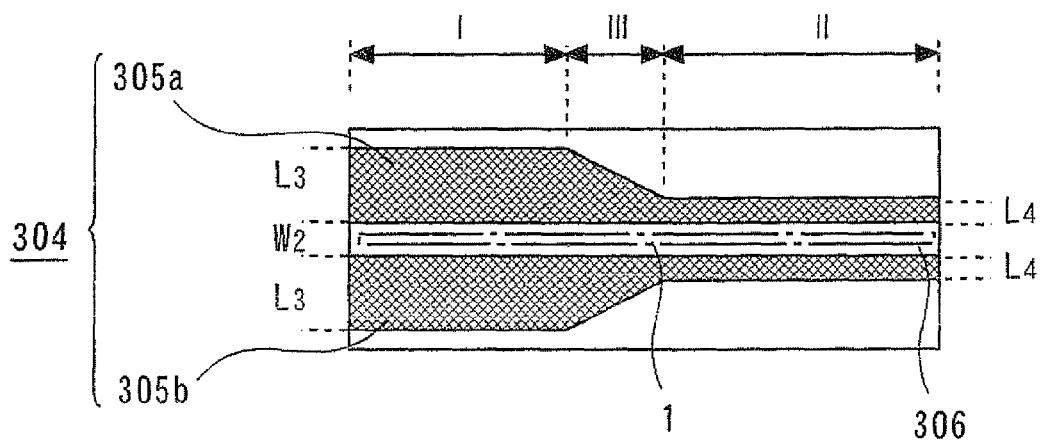

Next, as FIG. 14 shows, a second mask pattern 304 is formed on the region I, the region II, and the region III on the substrate 2. FIG. 15 shows a plan view of the second mask pattern 304 viewed from the upper surface of the substrate 2. As FIG. 15 shows, the second mask pattern 304 is composed of two stripe-shaped mask patterns 305a and 305b intersecting the region I, region III, and region II at predetermined distance $W_2$. ($W_2$ is not required to be identical to $W_1$ shown in FIG. 10.) These mask patterns have a third width $L_3$ in the region I, and a fourth width $L_4$ smaller than the third width $L_3$ in the region II. In the region III, the width gradually descends from $L_3$ to $L_4$ from the region I side toward the region II side. At this time, the opening 306 provided between the mask patterns 305a and 305b of the second mask pattern 304 is formed in the location having a region to overlap the location where the opening 303 of the first mask pattern 301 shown in FIG. 10 has been formed on the substrate 2. (The location of the finally formed optical modulator integrated semiconductor laser 1 on the wafer is shown in FIG. 15.)

By thus forming the second mask pattern 304 on the substrate 2, a stripe-shaped opening 306 is formed between the mask patterns 305a and 305b. At this time, the width of the mask patterns 305a and 305b in the region I is larger than the width in the region II. In the region III, the width is varied so as to connect the mask patterns 305a and 305b in the region I to the mask patterns 305a and 305b in the region II.

Next, an upper clad layer 10 is selectively formed on the substrate 2 in the region where the opening 303 of the first mask pattern 301 overlaps the opening 306 of the second mask pattern 304 as a mask. The upper clad layer 10 is formed using, for example, metal organic vapor phase epitaxial growth.

When the above-described upper clad layer 10 is formed, the growth rate is varied depending on the width of mask patterns 305a and 305b in both sides of the opening 306 of the mask pattern 304 shown in FIG. 15. Specifically, since the width of mask patterns 305a and 305b is large in the region I, the crystal growth rate is high in this region. In the region II, since the width of mask patterns 305a and 305b is smaller than the width in the region I, the crystal growth rate in this region is relatively lower than in the region I. In the region III, since the width of mask patterns 305a and 305b gradually descends from the region I side toward the region II side, the crystal growth rate also gradually descends from the region I side toward the region II side.

Figure 16:
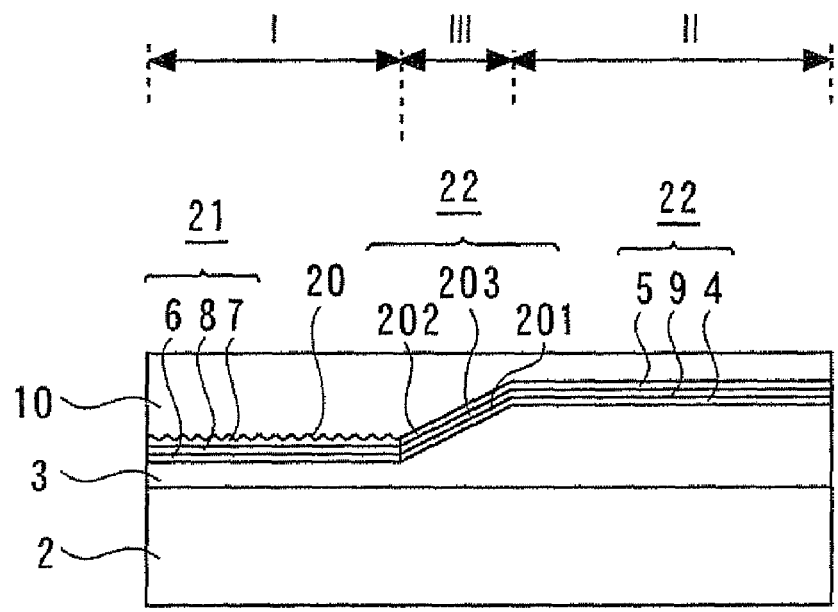

As a result, as FIG. 16 shows, the thickness of the upper clad layer 10 in the region I is greater than the thickness of the upper clad layer 10 in the region II, and in the region III, the thickness of the upper clad layer 10 gradually descends from the region I side toward the region II side. Specifically, the height of the upper clad layer 10 from the upper surface of the substrate 2 is substantially constant in regions I, II and III, and the upper surface of the upper clad layer 10 becomes substantially flat in regions I and III, and the region II.

Figure 17:
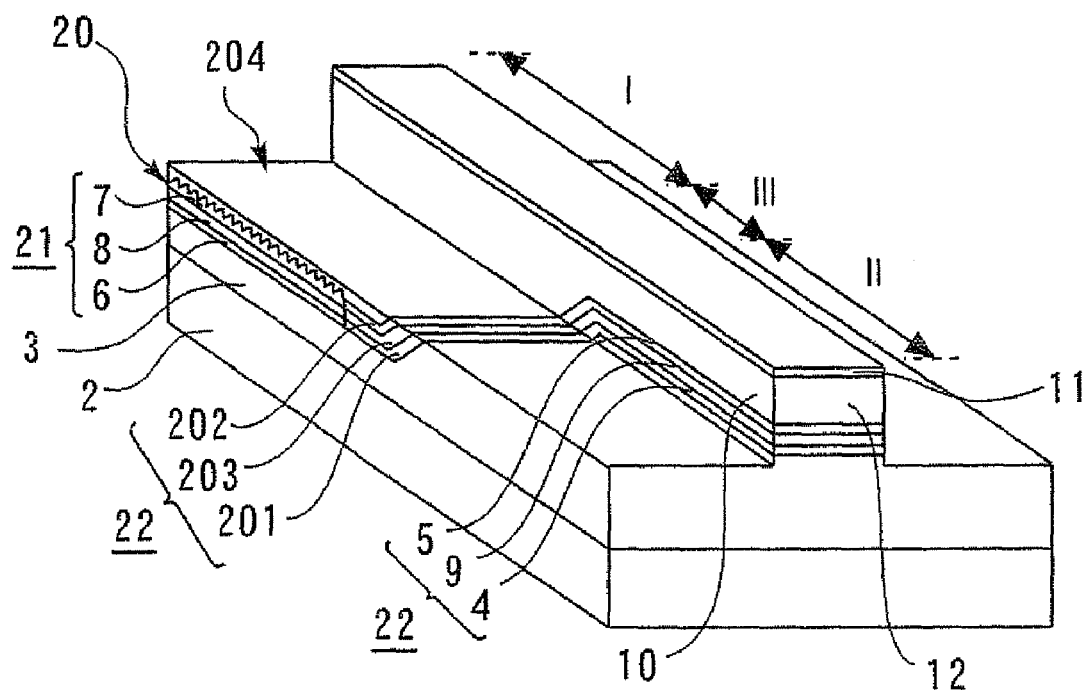

Next, the second mask pattern 304 shown in FIGS. 14 and 15 is removed, and a contact layer composed of n-type InGaAs is formed on the upper clad layer 10. Furthermore, using dry etching, such as RIE (reactive ion etching) or ICP (inductively coupled plasma), mesa stripes are formed on the substrate 2. As a result, a structure as shown in FIG. 17 (perspective view) can be obtained.

In this structures the height of the upper surface of the first core layer 21 in the region I (semiconductor laser section I), that is the height of the upper surface of the SCH layer 7 is smaller than the plane 204 in both outsides of the mesa stripes 12. The height of the lower surface of the second core layer 22 in the region II (modulator section II), that is, the height of the lower surface of the SCH layer 4 is greater than the plane 204 in both outsides of the mesa stripes 12. The height of the second core layer 22 in the region III (isolation section III), that is, the height of the absorption layer 203 and SCH layers 201 and 202 is gradually varied. The structure connects the active layer 8 in the region I to the absorption layer 9 in the region III, and connects the SCH layers 6 and 7 in the region I to the SCH layers 201 and 202 in the region III, respectively.

Next, the contact layer in the region III (isolation section III) is removed. Furthermore, a silicon oxide film is selectively formed on the surface other than the surface immediately above the mesa stripes 12. Finally, an n-type electrode is formed on the upper surface of the mesa stripes 12, and a p-type electrode is formed on the back surface side of the substrate 2.

According to the manufacturing method described above, a structure shown in FIG. 8, specifically, a structure having a semiconductor laser section I of a ridge-type waveguide, an optical modulator section II of a high-mesa-type waveguide, and an isolation section III for connecting the semiconductor laser section I and the optical modulator section II can be obtained. Then, an optical waveguide wherein the height of the core layer is gradually varied in the isolation section III to connect the core layer of the semiconductor laser section to the core layer of the optical modulator section; and an optical modulator integrated semiconductor laser having the optical waveguide can be obtained.

Third Embodiment

Figure 18:
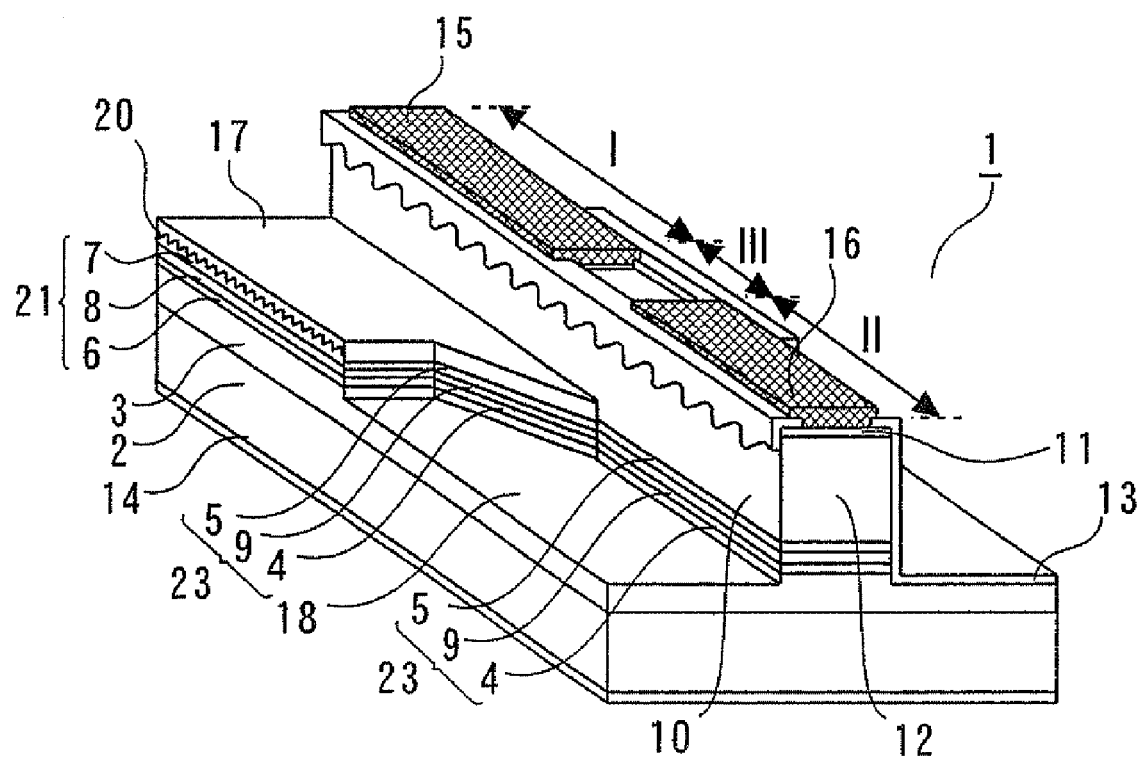
FIG. 18 is a diagram illustrating the optical modulator integrated semiconductor laser of the third embodiment

The third embodiment relates to an optical modulator integrated semiconductor laser with improved characteristics wherein reflection between the semiconductor laser section and the optical modulator section of the optical modulator integrated semiconductor laser. FIG. 18 is a diagram illustrating the optical modulator integrated semiconductor laser of the third embodiment. FIG. 18 is a perspective view of the optical modulator integrated semiconductor laser of the third embodiment. The configurations of the semiconductor laser section and the optical modulator section of the optical modulator integrated semiconductor laser according to of the third embodiment are identical to the configuration of the first embodiment shown in FIG. 1. The feature of the third embodiment is the arrangement of the lower clad layer 3, the first core layer 21, the second core layer 23, and the upper clad layer 10. The lower clad layer 3, the first core layer 21, the second core layer 23, and the upper clad layer 10 having the structures shown in FIG. 18 will be described in detail referring to FIGS. 19A 19B and 19C.

Figure 19:
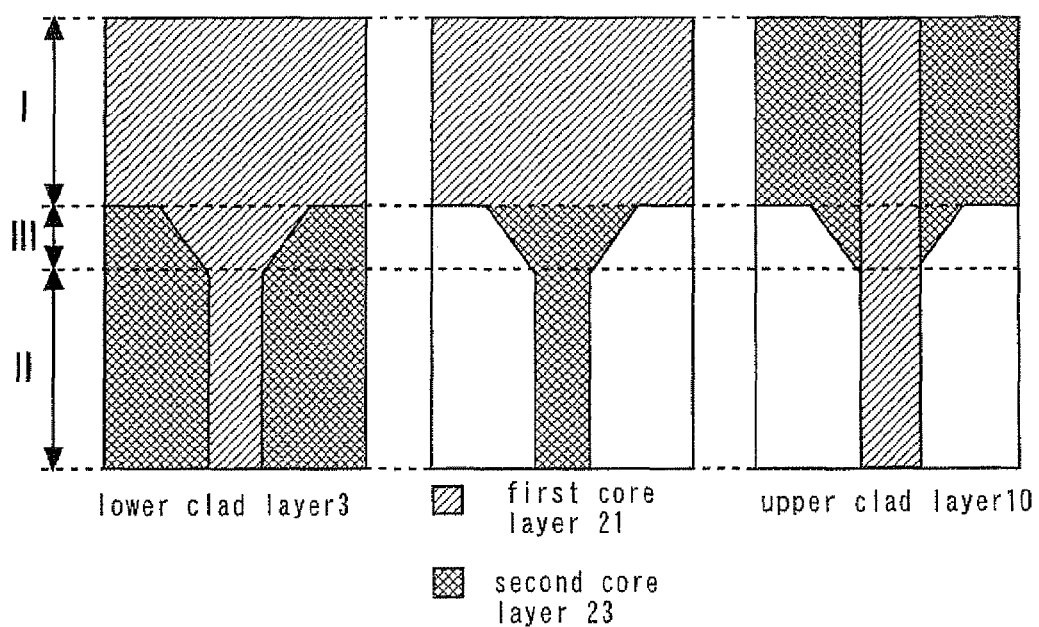
FIGS. 19A 19B and 19C are top view of the lower clad layer 3, the first core layer 21, the second core layer 23, and the upper clad layer 10.

FIGS. 19A 19B and 19C are top view of the lower clad layer 3, the first core layer 21, the second core layer 23, and the upper clad layer 10. FIG. 19A is a top view of the lower clad layer 3. The lower clad layer 3 is formed under the semiconductor laser section I, the optical modulator section II, and the isolation section III. The shaded region in FIG. 19A shows the region of the slightly etched lower clad layer 3. Therefore, the shaded region of the lower clad layer 3 shows the region where the lower clad layer 3 is thinner than the lower clad layer 3 in the diagonal-line region. Since etching of the lower clad layer 3 in the diagonal-line region is not intentionally performed, the lower clad layer 3 can form a flat plane throughout the semiconductor laser section I, the optical modulator section II, and the isolation section III.

Next, the arrangement of the first core layer 21 and the second core layer 23 shown in FIG. 19B will be described. As shown in FIG. 18, the first core layer 21 is a structure consisting of an SCH layer 6, an active layer 8, and an SCH layer 7. The second core layer 23 is a structure consisting of an SCH layer 4, an absorption layer 9, and an SCH layer 5. The first core layer 21 is formed in the semiconductor laser section I. The second core layer 23 is formed in the isolation section III so that the width thereof is gradually reduced from the plane contacting the semiconductor laser section I toward the plane contacting the optical modulator section II. The second core layer 23 has a plane contacting the first core layer. The second core layer 23 in the optical modulator section II is formed so as to maintain the width on the plane where the second core layer 23 in the isolation section III contacts the optical modulator section II. The second core layer 23 in the optical modulator section II is formed to be a stripe shape so as to be continuous with the second core layer 23 in the isolation section III. The first core layer 21 and the second core layer 23 are formed so as to overlap the diagonal-line region in FIG. 19A.

Next, the arrangement of the upper clad layer 10 shown in FIG. 19C will be described. The upper clad layer 10 is formed on the upper layers of the first core layer 21 and the second core layer 23 so as to overlap the region where they are formed. Both the shaded and diagonal-line regions in FIG. 19C are regions where the upper clad layer 10 is formed. However, the shaded region is thinner than the diagonal-line region because the thickness of the upper clad layer is reduced by etching. The etching is performed to form the mesa stripe 12. The width of the upper clad layer 10 represented by the diagonal-line region in FIG. 19C is constant throughout the semiconductor laser section I, the optical modulator section II, and the isolation section III. The upper clad layer 10 represented by the diagonal-line region constitutes a part of the mesa stripe 12 shown in FIG. 18.

Figure 20:
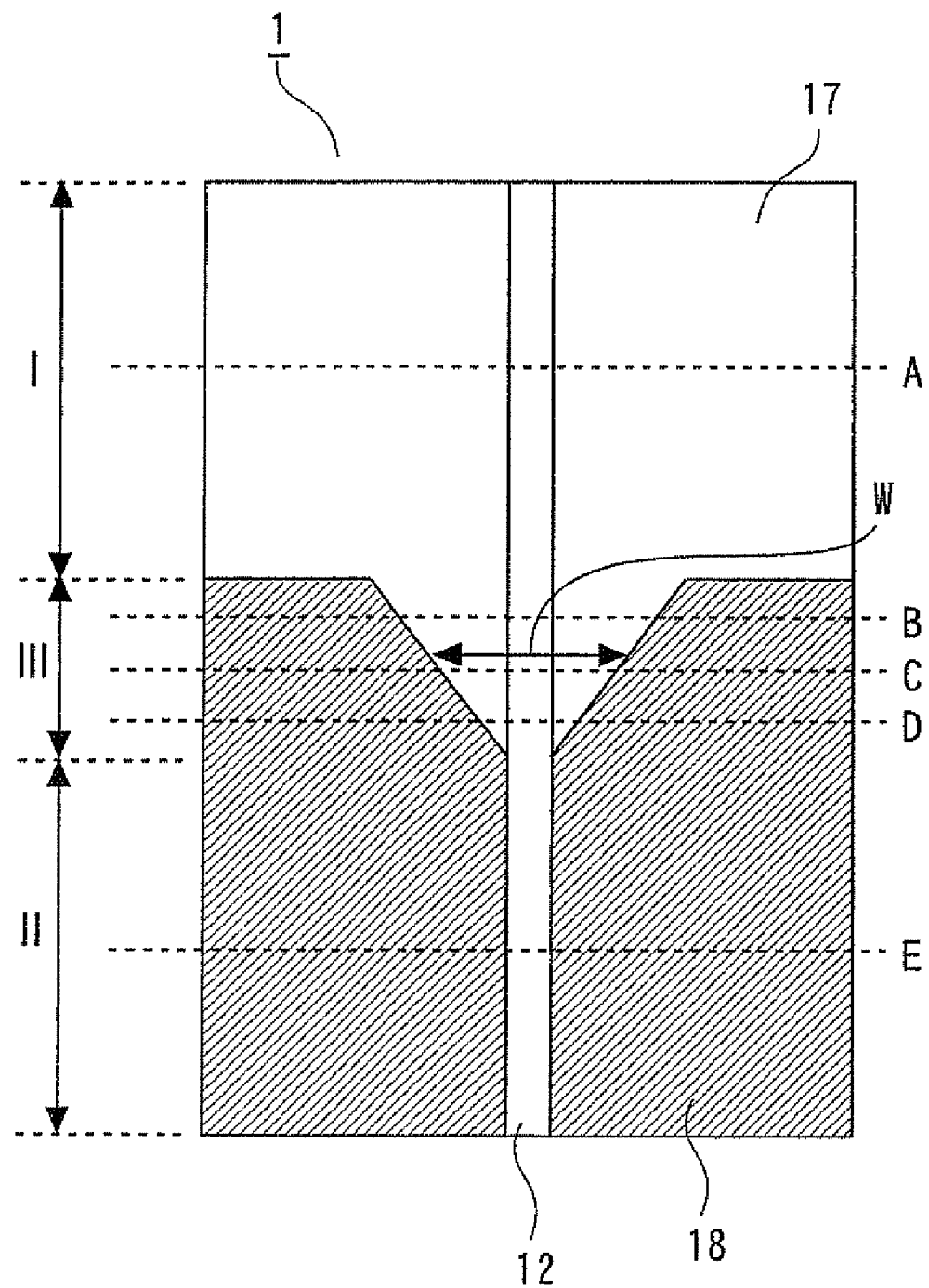
FIG. 20 is the top view of the structure shown in FIG. 18.
Figure 21:
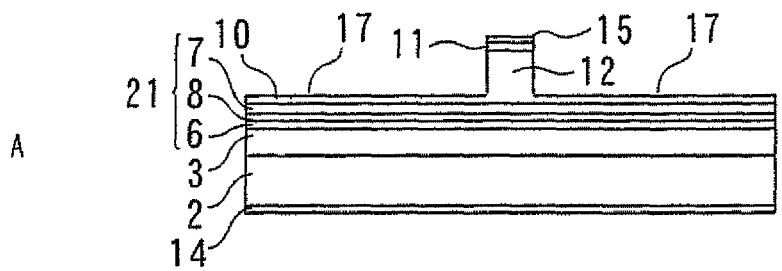
FIGS. 21, 22, 23, 24 and 25 are cross-sections of the optical modulator integrated semiconductor laser along the dashed lines A, B, C, D and E in FIGS. 19A 19B and 19C.
Figure 22:
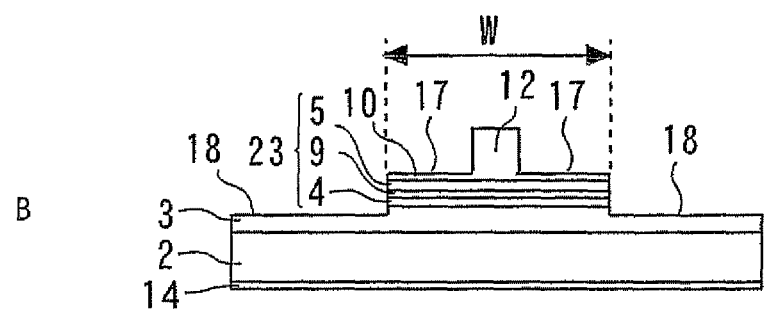
Figure 23:
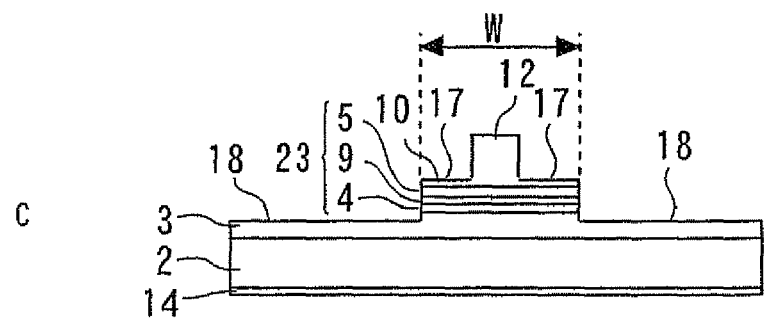
Figure 24:
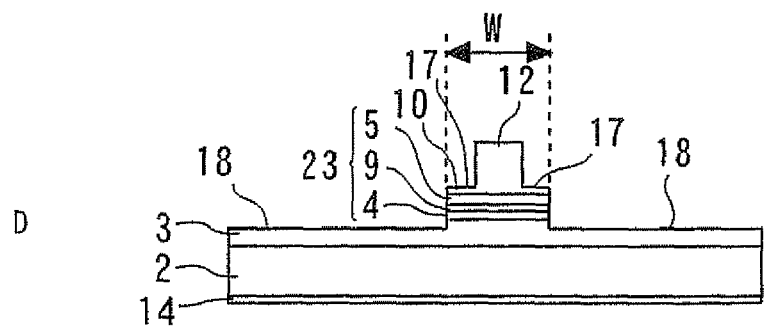
Figure 25:
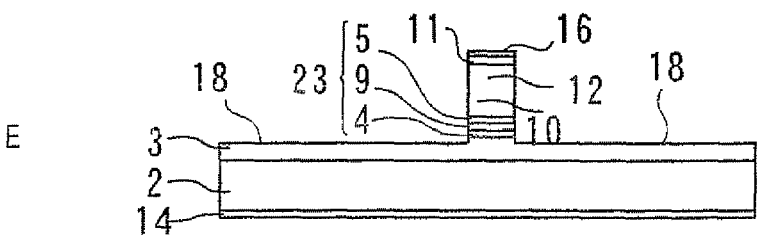

As described above, in the optical modulator integrated semiconductor laser of the third embodiment, the first core layer 21 and the second core layer 23 shown in FIG. 19B are formed on the upper layer of the lower clad layer 3 shown in FIG. 19A so as to overlap the diagonal-line region of the lower clad layer 3. Furthermore, the optical modulator integrated semiconductor laser is provided with the configuration wherein the upper clad layer 10 is formed on the upper layer of the first core layer 21 and the second core layer 23 so as to overlap the first core layer 21 or the second core layer 23 (FIG. 19C). Here, FIG. 20 shows the top view of the structure shown in FIG. 18. In FIG. 20, electrodes 15 and 16 are omitted for the convenience of description. The plane 17 is the surface of the upper clad layer 10, and the plane 18 is the surface of the lower clad layer 3. In FIG. 20, the width of the plane 17 in the isolation section III in lengthwise direction and the vertical direction of the mesa stripe is denoted by W. The width W takes the largest value at the portion where the isolation section III contacts the semiconductor laser section I, and is gradually reduced toward the portion contacting the optical modulator section II. W agrees with the width of the mesa stripe 12 at the portion contacting the optical modulator section II. The cross-sections of the optical modulator integrated semiconductor laser along the dashed lines A, B, C, D and E in FIG. 20 are shown in FIGS. 21, 22, 23, 24 and 25, respectively.

As described above, the both outsides of the mesa stripe 12 in the isolation section III of the third embodiment have configurations wherein W is gradually reduced from the portion contacting the semiconductor laser section I toward the portion contacting the optical modulator section II. With such a structure, the optical-mode distribution of light generated in the semiconductor laser section I to be transmitted to the optical modulator section II can be gradually varied. By continuously varying the optical-mode distribution of light from the semiconductor laser section I to the optical modulator section II, the reflection of light between the semiconductor laser section I and the optical modulator section II can be suppressed. Furthermore, by suppressing reflection as described above, the loss of optical power can be reduced, and the single wavelength property of the laser can be maintained.

Figure 26:
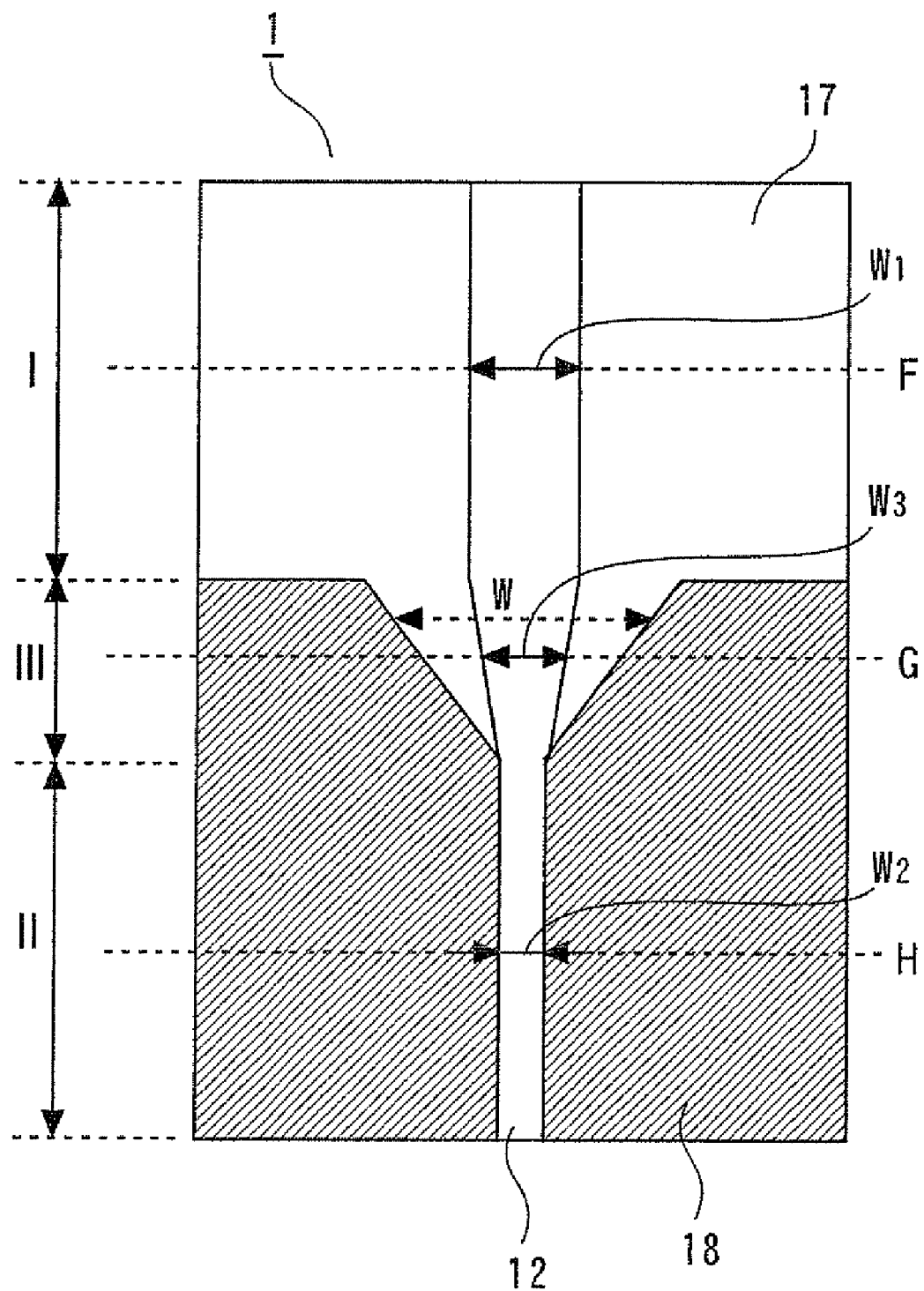
FIGS. 26, 27, 28 and 29 are diagrams illustrating a transformation of the optical modulator integrated semiconductor laser of the third embodiment.
Figure 27:
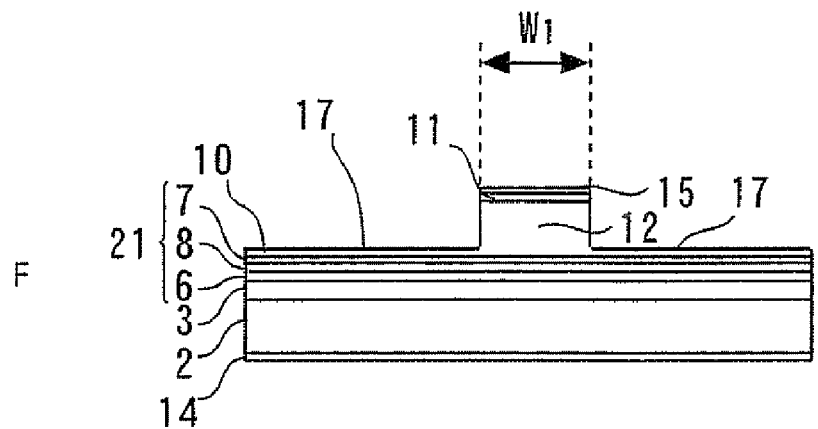
Figure 28:
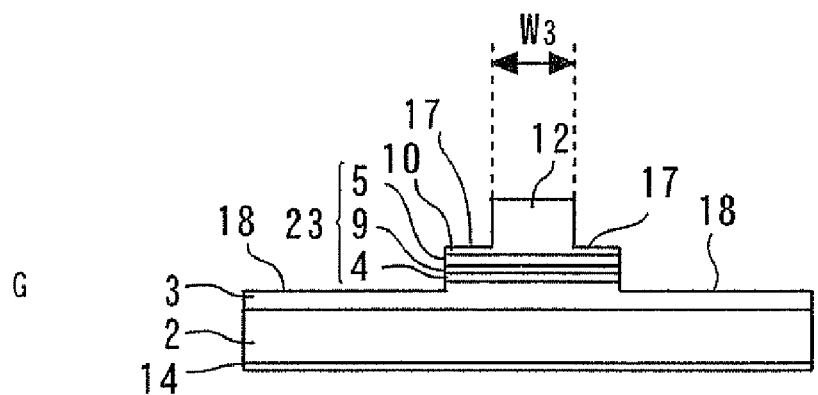
Figure 29:
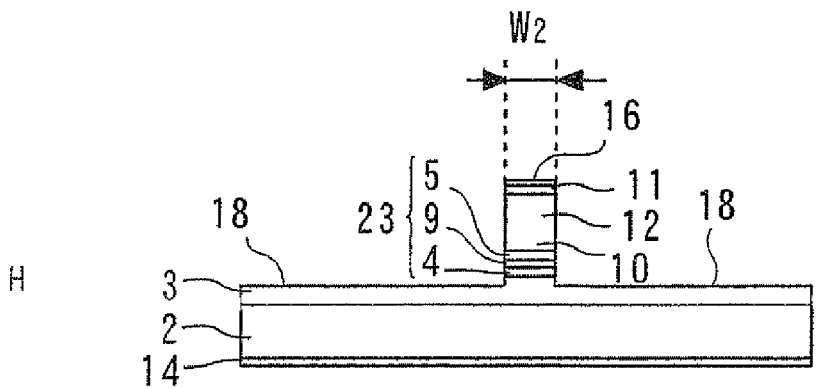

Although the length in lengthwise direction and the vertical direction of the mesa stripe 12 (hereafter referred to as "mesa stripe width") is constant throughout the semiconductor laser section I, the optical modulator section II, and the isolation section III in the third embodiment, the present invention is not limited thereto. Specifically, even if the mesa stripe width W1 of the semiconductor laser section I is different from the mesa stripe width W2 of the optical modulator section II as the top view of the optical modulator integrated semiconductor laser shown in FIG. 26, the effect of the present invention can be obtained as long as the width W of the isolation section III is gradually reduced from the contacting plane with the semiconductor laser section I toward the contacting plane with the optical modulator section II as described above. The cross-sections along the dashed lines F, G and H in FIG. 26 are shown in FIGS. 27, 28 and 29, respectively. By optimizing each of the mesa stripe width W1 of the semiconductor laser section I and the mesa stripe width W2 of the optical modulator section II as described above, the properties can be optimized. Specifically, properties, such as the current-optical output properties, the temperature dependence of threshold current-optical output, the modulation bands of the optical modulator, and the extinction ratio, can be optimized. Therefore, according to the configuration as shown in FIG. 26, various properties can be optimized by optimizing the mesa stripe width while suppressing the reflection of light between the semiconductor laser section I and the optical modulator section II.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-218762, filed on Aug. 10, 2006 including specification, claims, drawings and summary, on which the Convention priority of the present application is based, are incorporated herein by reference in its entirety.

What is claimed is:
1. An optical waveguide comprising:
a substrate having upper and lower surfaces;
a common electrode disposed on the lower surface of the substrate;
a semiconductor laser section having
a lower cladding layer, a first core layer, and an upper cladding layer, sequentially laminated on the upper surface of the substrate in a mesa stripe, wherein at least part of the upper cladding layer extends outwardly from, beyond, and transverse to both sides of the mesa stripe with a substantially planar first surface, and a laser electrode, wherein laser light is generated in the first core layer in response to an electrical signal applied across the common electrode and the laser electrode;

an intermediate section located adjacent to the semiconductor laser section on the upper surface of the substrate, and having the lower cladding layer, a second core layer, and the upper cladding layer sequentially laminated on the substrate, wherein the second core layer is connected to the first core layer in the mesa stripe, and at least parts of the lower cladding layer, the second core layer, and the upper cladding layer extend outwardly from, beyond, and transverse to both sides of the mesa stripe with a substantially planar third surface; and an optical modulator section located adjacent to the intermediate section on the upper surface of the substrate, so that the intermediate section is sandwiched by the semiconductor laser section and the optical modulator section, the optical modulator section having the lower cladding layer, the second core layer, and the upper cladding layer sequentially laminated on the upper surface of the substrate, and a modulator electrode, wherein the second core layer absorbs the laser light generated in the first core layer in response to an electrical signal applied across the common electrode and the modulator electrode, wherein at least part of the lower cladding layer extends outwardly from, beyond, and transverse to both sides of the mesa stripe in the optical modulator section with a substantially planar second surface, the first surface is farther from the upper surface of the substrate than is the second surface, and the third surface decreases in distance from the upper surface of the substrate, in the intermediate section, from the first surface toward the second surface.

2. An optical waveguide comprising:

a substrate having upper and lower surfaces;

a common electrode disposed on the lower surface of the substrate;

a semiconductor laser section having a lower cladding layer, a first core layer, and an upper cladding layer, sequentially laminated on the upper surface of the substrate in a mesa stripe, wherein at least part of the upper cladding layer extends outwardly from, beyond, and transverse to both sides of the mesa stripe with a substantially planar first surface, and a laser electrode, wherein laser light is generated in the first core layer in response to an electrical signal applied across the common electrode and the laser electrode;

an intermediate section located adjacent to the semiconductor laser section on the upper surface of the substrate, and having the lower cladding layer, a second core layer, and the upper cladding layer sequentially laminated on the substrate, wherein the second core layer is connected to the first core layer in the mesa stripe, and at least parts of the lower cladding layer, the second core layer, and the upper cladding layer extend outwardly from, beyond, and transverse to both sides of the mesa stripe with a substantially planar third surface; and an optical modulator section located adjacent to the intermediate section on the upper surface of the substrate, so that the intermediate section is sandwiched by the semiconductor laser section and the optical modulator section, the optical modulator section having the lower cladding layer, the second core layer, and the upper cladding layer sequentially laminated on the upper surface of the substrate, and a modulator electrode, wherein the second core layer absorbs the laser light generated in the first core layer in response to an electrical signal applied across the common electrode and the modulator electrode, wherein at least part of the lower cladding layer extends outwardly from, beyond, and transverse to both sides of the mesa stripe in the optical modulator section with a substantially planar second surface, the first, second, and third surfaces are the same distance from the upper surface of the substrate, and the distance of the second core layer from the upper surface of the substrate, in the intermediate section, increases from the semiconductor laser section toward the optical modulator section.

3. The optical waveguide according to claim 2, wherein thickness of the optical modulator section, from the upper surface of the substrate to a lower end of the second core layer, is larger than thickness of the semiconductor laser section, from the upper surface of the substrate to an upper end of the first core layer.

4. A semiconductor optical integrated element according to claim 1, including a diffraction grating on an upper portion of the first core layer of the semiconductor laser section.

5. An optical waveguide comprising:

a substrate having upper and lower surfaces;

a common electrode disposed on the lower surface of the substrate;

a semiconductor laser section having a lower cladding layer, a first core layer, and an upper cladding layer, sequentially laminated on the upper surface of the substrate in a mesa stripe, wherein at least part of the upper cladding layer extends outwardly from, beyond, and transverse to both sides of the mesa stripe with a substantially planar first surface, and a laser electrode, wherein laser light is generated in the first core layer in response to an electrical signal applied across the common electrode and the laser electrode;

an intermediate section located adjacent to the semiconductor laser section on the upper surface of the substrate, and having the lower cladding layer, a second core layer, and the upper cladding layer sequentially laminated on the substrate, wherein the second core layer is connected to the first core layer in the mesa stripe, and at least parts of the lower cladding layer, the second core layer, and the upper cladding layer extend outwardly from, beyond, and transverse to both sides of the mesa stripe with a substantially planar third surface; and an optical modulator section located adjacent to the intermediate section on the upper surface of the substrate, so that the intermediate section is sandwiched by the semiconductor laser section and the optical modulator section, the optical modulator section having the lower cladding layer, the second core layer, and the upper cladding layer sequentially laminated on the upper surface of the substrate, and a modulator electrode, wherein the second core layer absorbs the laser light generated in the first core layer in response to an electrical signal applied across the common electrode and the modulator electrode, wherein at least part of the lower cladding layer extends outwardly from, beyond, and transverse to both sides of the mesa stripe in the optical modulator section with a substantially planar second surface, and the distance of the first surface from the upper surface of the substrate is larger than the distance of the second surface from the upper surface of the substrate.

6. A semiconductor optical integrated element comprising:
a substrate having upper and lower surfaces;
a common electrode disposed on the lower surface of the substrate;
a semiconductor laser section having
a lower cladding layer, a first core layer, and an upper cladding layer, sequentially laminated on the upper surface of the substrate in a mesa stripe, wherein at least part of the upper cladding layer extends outwardly from, beyond, and transverse to both sides of the mesa stripe with a substantially planar first surface, and a laser electrode, wherein laser light is generated in the first core layer in response to an electrical signal applied across the common electrode and the laser electrode;

an intermediate section located adjacent to the semiconductor laser section on the upper surface of the substrate, and having the lower cladding layer, a second core layer, and the upper cladding layer sequentially laminated on the substrate, wherein the second core layer is connected to the first core layer in the mesa stripe, and at least parts of the lower cladding layer, the second core layer, and the upper cladding layer extend outwardly from, beyond, and transverse to both sides of the mesa stripe with a substantially planar third surface; and an optical modulator section located adjacent to the intermediate section on the upper surface of the substrate, so that the intermediate section is sandwiched by the semiconductor laser section and the optical modulator section, the optical modulator section having the lower cladding layer, the second core layer, and the upper cladding layer sequentially laminated on the upper surface of the substrate, and a modulator electrode, wherein the second core layer absorbs the laser light generated in the first core layer in response to an electrical signal applied across the common electrode and the modulator electrode, wherein at least part of the lower cladding layer extends outwardly from, beyond, and transverse to both sides of the mesa stripe in the optical modulator section with a substantially planar second surface, the first, second, and third surfaces are the same distance from the upper surface of the substrate, the distance of the second core layer from the upper surface of the substrate in the intermediate section increases from the semiconductor laser section toward the optical modulator section, and thickness of the optical modulator section, from the upper surface of the substrate to a lower end of the second core layer, is larger than thickness of the semiconductor laser section, from the upper surface of the substrate to an upper end of the first core layer.

7. A semiconductor optical integrated element comprising:
a lower cladding layer,
a light-generating first core layer disposed only on a laser section of an upper surface of the lower cladding layer,
a light-absorbing second core layer disposed only on an intermediate section and an optical modulator section of the upper surface of the lower cladding layer, where the first core layer is not present on the upper surface of the lower cladding layer, and
an upper cladding layer overlapping at least part of the first core layer in the laser section and the second core layer in the intermediate and optical modulator sections, wherein the intermediate section is sandwiched by the laser section and the optical modulator section, the second core layer, in the intermediate section, tapers in width and includes a widest surface that abuts the first core layer at the laser section, and the second core layer becomes narrower in width in a direction from the laser section toward the optical modulator section, to a predetermined width, and includes a stripe section having a predetermined width in the optical modulator section and abutting the intermediate section.

8. The semiconductor optical integrated element according to claim 7, wherein the upper cladding layer has, in the laser, intermediate, and optical modulator sections, the predetermined width of the stripe section, and is thicker within the predetermined width than at other portions of the upper cladding layer in the laser and intermediate sections.

9. The semiconductor optical integrated element according to claim 7, wherein
the upper cladding layer has a portion that is thicker than other portions of the upper cladding layer, in the stripe section, and in the laser section, and
the portion of the upper cladding layer that is thicker than other portions of the upper cladding layer on the first core layer, has a width that is larger than the predetermined width in the optical modulator section.

10. The optical waveguide according to claim 1, wherein the first and second surfaces are generally parallel to the upper surface of the substrate.

11. The optical modulator according to claim 2, wherein the first, second, and third surfaces are generally parallel to the upper surface of the substrate.

12. The optical modulator according to claim 5, wherein the first and third surfaces are generally parallel to the upper surface of the substrate.

13. The optical modulator according to claim 6, wherein the first, second, and third surfaces are generally parallel to the upper surface of the substrate.

* * * * *